(12) United States Patent
Warschauer (10) Patent No.: US 9,619,728 B2
(45) Date of Patent: Apr. 11, 2017

(54) DYNAMIC CREATION OF BACKUP FIDUCIALS

(71) Applicant: FEI Company, Hillsboro, OR (US)

(72) Inventor: Reinier Louis Warschauer, Portland, OR (US)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 14/726,573

(22) Filed: May 31, 2015

(65) Prior Publication Data

US 2016/0350614 A1    Dec. 1, 2016

(51) Int. Cl.
*G06K 9/00*   (2006.01)
*G06K 9/32*   (2006.01)
*G06T 7/00*   (2017.01)

(52) U.S. Cl.
CPC .......... *G06K 9/3216* (2013.01); *G06T 7/0004* (2013.01); *G06T 7/0042* (2013.01); *G06T 7/0081* (2013.01); *G06K 9/00* (2013.01); *G06K 2009/3225* (2013.01); *G06T 2207/30164* (2013.01); *G06T 2207/30204* (2013.01)

(58) Field of Classification Search
CPC .............. A61N 5/1031; A61N 5/1042; G01N 23/2251; G01N 1/06; G01N 1/32; G03F 7/70625; G03F 7/70475; G21K 1/046; H01J 2237/24592; H01J 2237/2485; H01J 2237/2817; H01J 2237/31745; H01J 37/28; H01J 37/222; H01J 37/3045; H01J 2237/2482; H01J 37/228; H01J 2237/063; H01J 2237/208; H01J 2237/2802; H01J 37/26; H01J 37/30; H01L 21/67253; H01L 21/67276; H01L 22/12; G06T 2207/10061; G06T 2207/30148; G06T 7/0042; G06T 7/0004; B82Y 10/00; B82Y 40/00; G01B 15/08; Y10T 428/24
USPC ............ 382/103; 250/309, 310; 216/92, 83; 156/345; 355/53, 55, 77
See application file for complete search history.

(56) References Cited

U.S. PATENT DOCUMENTS

| | | | | |
|---|---|---|---|---|
| 5,168,166 A | * | 12/1992 | Hayakawa | G02B 21/002 250/491.1 |
| 5,851,413 A | | 12/1998 | Casella et al. | |
| 5,892,230 A | * | 4/1999 | Goodberlet | B82Y 10/00 250/361 R |
| 6,606,534 B1 | * | 8/2003 | Abiko | B21B 37/66 700/150 |
| 6,710,847 B1 | * | 3/2004 | Irie | G03F 7/70475 235/462.05 |
| 8,502,172 B1 | | 8/2013 | Bugge et al. | |

(Continued)

FOREIGN PATENT DOCUMENTS

| | | |
|---|---|---|
| JP | S5627927 | 3/1981 |
| JP | S5795627 | 6/1982 |

(Continued)

*Primary Examiner* — Vu Le
*Assistant Examiner* — Aklilu Woldemariam
(74) *Attorney, Agent, or Firm* — Scheinberg & Associates, P.C.; Michael O. Scheinberg (57) ABSTRACT

Multiple reference fiducials are formed on a sample on a sample for charged particle beam facilities processing of the sample. As one fiducial is degraded by the charged particle beam, a second fiducial is used to create one or more additional fiducials.

20 Claims, 9 Drawing Sheets

(56) References Cited

U.S. PATENT DOCUMENTS

| | | | |
|---|---|---|---|
| 2002/0088940 A1* | 7/2002 | Watanabe | H01J 37/224 |
| | | | 250/310 |
| 2002/0092985 A1 | 7/2002 | Ishitani et al. | |
| 2004/0158409 A1* | 8/2004 | Teshima | H01J 37/28 |
| | | | 702/22 |
| 2007/0018099 A1* | 1/2007 | Chitturi | G01B 15/08 |
| | | | 250/310 |
| 2009/0218488 A1* | 9/2009 | Wells | H01J 37/3056 |
| | | | 250/307 |
| 2010/0294930 A1* | 11/2010 | Preikszas | H01J 37/026 |
| | | | 250/307 |
| 2015/0206707 A1 | 7/2015 | Arjavac et al. | |
| 2015/0357159 A1* | 12/2015 | Stone | H01J 37/3056 |
| | | | 204/192.33 |

FOREIGN PATENT DOCUMENTS

| | | |
|---|---|---|
| JP | 2941732 | 8/1999 |
| JP | 2009139132 | 6/2009 |
| WO | 2014106182 | 7/2014 |

* cited by examiner

DYNAMIC CREATION OF BACKUP FIDUCIALS

TECHNICAL FIELD

The present invention relates to a method and apparatus for correcting drift in a charged particle beam system.

BACKGROUND

Charged particle beam systems are used in a variety of applications, including the manufacture, repair, and inspection of micro-fabricated devices, such as integrated circuits, magnetic recording heads, and photolithography masks. Charged particle beam systems may include electron beams, ion beams systems, or laser beams and may include more than one type of beam. Micro-fabrication typically includes creating or altering structures having very small dimensions, such as, for example, dimensions of tens of microns or less. As device geometries continue to shrink and new materials are introduced, the structural complexity of today's semiconductors grows exponentially allowing for smaller and smaller structures to be fabricated.

With such small structures it is necessary to direct the processing beam with great precision and accuracy. However, during processing the impact point of a beam on a sample tends to drift over time. For example, an operator may position the beam at point A at the beginning of a processing operation but the beam drifts to point B after a short time. The difference between the positions of point A and point B is referred to as beam drift. Beam drift can be caused by mechanical or thermal instabilities that cause slight movement of the stage on which the sample is supported or of the elements that generate and focus the beam.

A common method of accurately positioning a beam is to create a reference mark on the sample such as, for example, by milling. Such a reference mark is referred to as a fiducial. The beam is then positioned relative to the fiducial. A beam is initially directed to image the fiducial which is typically located near an area of the sample to be processed, typically referred to as a region of interest (ROI). A vector between the ROI and the fiducial is determined and the fiducial is then used to track the beam position during the processing of the ROI. The fiducial is designed in a shape that is recognizable by an image recognition program allowing automatic positional tracking of the fiducial, and therefore the ROI. The beam periodically images the fiducial and any drift of the beam is corrected. During processing the beam is typically repeatedly scanned across the ROI and may be programmed to have variable dwell time of the beam on the ROI. Due to the high kinetic energy of particles in the beam any exposure of the sample surface surrounding the ROI to the beam tends to damage the surface through etching. Additional damage to the surface may occur during imaging as the beam is scanned across the surface. Eventually, the fiducial becomes so damaged that it is no longer recognizable by image recognition, and therefore is no longer useable for positional tracking.

Figure 1A:
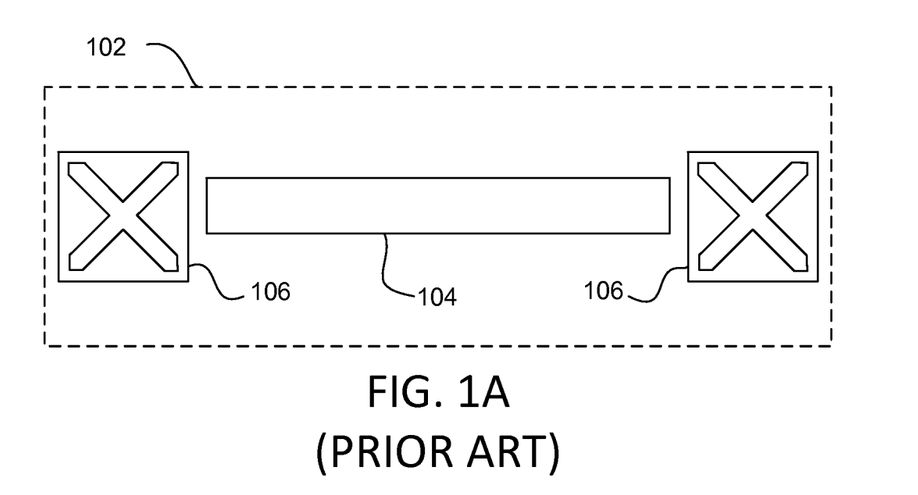
FIG. 1A shows a prior art method for tracking beam drift with an image frame that includes a region of interest before processing with intact fiducials.
Figure 1B:
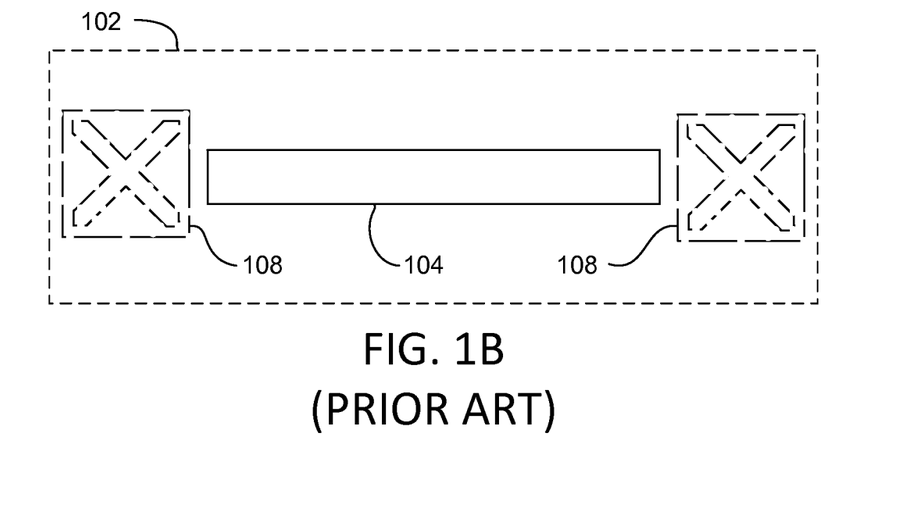
FIG. 1B shows a prior art method similar to that shown in FIG. 1A with damaged fiducials.

FIGS. 1A-1B illustrate a commonly used method of correcting beam drift using fiducials. FIG. 1A shows a region of interest 104 on the surface of a sample. Fiducials 106 are created proximal to the region of interest 104 to allow for positional tracking of the region of interest 104. Image frame 102 depicts the boundary of the area scanned by the beam during imaging and includes fiducials 106 and region of interest 104. The interior of image frame 102 is the area scanned with the beam when imaging, and therefore receives damage from beam exposure. FIG. 1B shows image frame 102 after processing with the beam for a period of time. Due to exposure to the beam, fiducials 106 become damaged as seen at 108 and are no longer identifiable by image recognition. At this point it is no longer possible to track the location of the beam relative to region of interest 104.

A common use of charged particle processing is the creation of thin specimens for viewing in a transmission electron microscope (TEM). Several techniques are known for preparing TEM specimens. Techniques generally referred to as "lift-out" techniques use focused ion beams to cut the sample from a substrate or bulk sample without destroying or damaging surrounding parts of the substrate. Such techniques require precise positioning of the beam. To automate lift-out techniques, the position of the beam relative to the sample should be automatically ascertainable with a high degree of accuracy, and the degradation of a fiducial reduces the accuracy.

Such techniques are useful in analyzing the results of processes used in the fabrication of integrated circuits, as well as materials general to the physical or biological sciences. These techniques can be used to analyze samples in any orientation (e.g., either in cross-section or in plan view). Some techniques extract a sample sufficiently thin for use directly in a TEM; other techniques extract a "chunk" or large sample that requires additional thinning before observation. In addition, these "lift-out" specimens may also be directly analyzed by other analytical tools, other than TEM. Techniques where the sample is extracted from the substrate within the focused ion beam (FIB) system vacuum chamber are commonly referred to as "in-situ" techniques; sample removal outside the vacuum chamber (as when the entire wafer is transferred to another tool for sample removal) are call "ex situ" techniques.

What is needed is an improved method of creating a fiducial on a sample for positional tracking of a region of interest during processing by a charged particle beam system.

SUMMARY

An object of the invention is to provide improved charged particle beam processing.

Multiple reference fiducials are formed on a sample on a sample for charged particle beam facilities processing of the sample. As one fiducial is degraded by the charged particle beam, a second fiducial is used to create one or more additional fiducials.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the scope of the invention as set forth in the appended claims.

BRIEF DESCRIPTION OF THE DRAWINGS

For a more thorough understanding of the present disclosure, and advantages thereof, reference is now made to the following descriptions taken in conjunction with the accompanying drawings, in which.

DETAILED DESCRIPTION

In the drawings and description that follow, like parts are typically marked throughout the specification and drawings with the same reference numerals, respectively. In addition, similar reference numerals may refer to similar components in different embodiments disclosed herein. The drawing figures are not necessarily to scale. Certain features of the invention may be shown exaggerated in scale or in somewhat schematic form and some details of conventional elements may not be shown in the interest of clarity and conciseness. The present invention is susceptible to embodiments of different forms. Specific embodiments are described in detail and are shown in the drawings, with the understanding that the present disclosure is not intended to limit the invention to the embodiments illustrated and described herein. It is to be fully recognized that the different teachings of the embodiments discussed herein may be employed separately or in any suitable combination to produce desired results.

In the following discussion and in the claims, the terms "including" and "comprising" are used in an open-ended fashion, and thus should be interpreted to mean "including, but not limited to . . . ." To the extent that any term is not specially defined in this specification, the intent is that the term is to be given its plain and ordinary meaning. Furthermore, use of the term "and/or" herein shall be construed as an "inclusive" or, and not an "exclusive" or. For example, used herein the phrase "A and/or B" would mean "A, B, or A and B." As another example, used herein the phrase "A, B, and/or C" would mean "A, B, C, or any combination thereof." Further, whenever the terms "automatic," "automated," or similar terms are used herein, those terms will be understood to include manual initiation of the automatic or automated process or step.

In one embodiment, a sample is loaded into a charged particle beam system and a region of interest on a sample is located. At least one primary fiducial is created at a location proximal to the region of interest and a first backup fiducial is created. The region of interest is processed with the charged particle beam using the primary fiducial to track the location of the region of interest until identification of the primary fiducial by image recognition begins to fail. A second backup fiducial is then created. The region of interest is further processed using the first backup fiducial to track the location of the region of interest. Processing of the region of interest continues using the first backup fiducial to track location of the region of interest until identification of the first backup fiducial begins to fail. If necessary, a further backup fiducial is created. Processing of the region of interest then continues using the second backup fiducial. This cycle of creating additional backup fiducials can be repeated as long as the processing operation continues and the fiducials start to fail.

In another embodiment, a sample is loaded into a charged particle beam system and a region of interest on a sample is located. At least one primary fiducial is created at a location proximal to the region of interest and a first backup fiducial is created. The region of interest is processed with the charged particle beam using the primary fiducial to track the location of the region of interest until recognition of the primary fiducial begins to fail. The primary fiducial is then recreated using the first backup fiducial to accurately locate the recreated primary fiducial. Processing of the region of interest may then continue using the new primary fiducial. The primary fiducial can be recreated as many times as necessary until the processing operation is complete.

In some embodiment, additional working fiducials are created while the work piece during processing of the work piece, which is referred to as "dynamic fiducial creation."

A beam controller directs a beam to specified coordinates using a beam controller coordinate system in response to a stored program or operator instructions. The beam controller coordinate system does not always correspond exactly to a sample coordinate system fixed with respect to the sample surface because of misalignment and drift. A fiducial is typically located near the area of the sample to be processed and is imaged in order to track any drift that might occur and allow for any correction. Imaging the fiducial allows the controller to determine coordinate offsets to bring the beam controller coordinate system back into alignment with the sample coordinate system. During processing, however, the fiducial becomes damaged or eroded due to residual effects of the beam. Periodic imaging of the fiducial causes further damage until the fiducial is no longer recognizable by image recognition software and is no longer useful in correcting drift.

FIGS. 2A-2D show a first embodiment for using fiducials to correct for beam drift. A sample is provided with an area containing a region of interest for processing with a charged particle beam. The region of interest is imaged with an image recognition program. When imaging a sample, an area to be imaged is defined and scanned by the beam, while collecting data to be used for construction of an image. An "image frame" defines the area on the sample scanned by the beam while collecting data for construction of an image. The area within the image frame receives beam exposure during processing and imaging, and therefore is damaged by the beam.

Figure 2A:
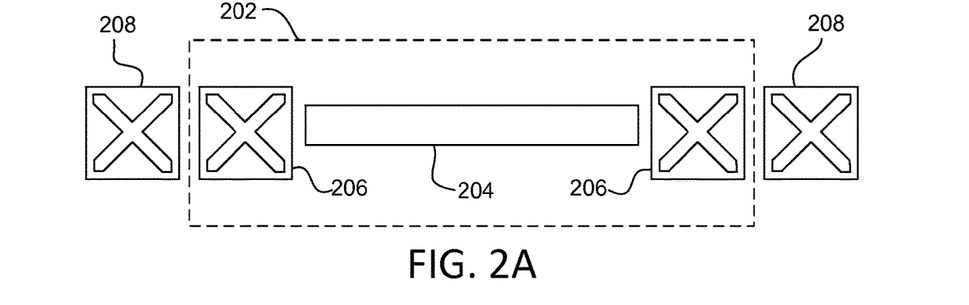
FIG. 2A shows an image frame at the start of processing including a region of interest with intact primary fiducials and backup fiducials located outside the image frame.
Figure 2B:
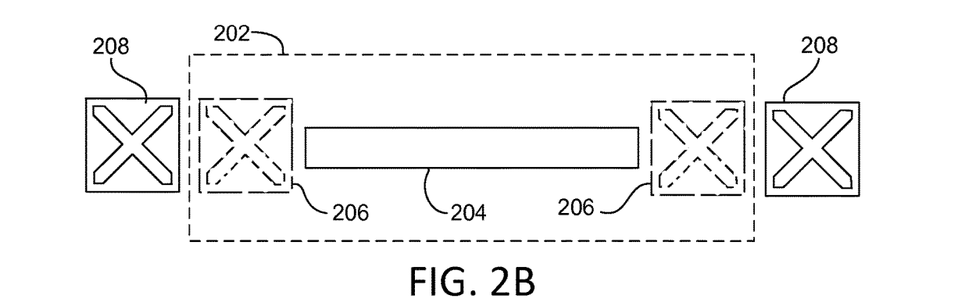
FIG. 2B is similar to FIG. 2A with damaged primary fiducials.
Figure 2C:
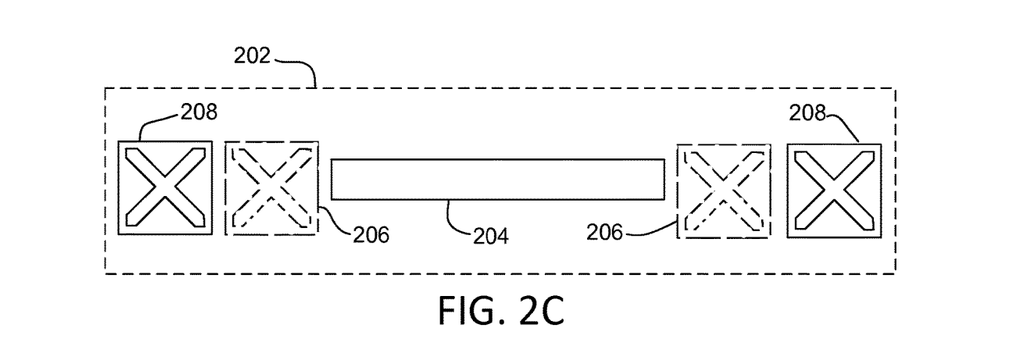
FIG. 2C shows an expanded image frame that includes intact backup fiducials.

Referring now to FIG. 2A, an area within an image frame 202 is taken on a sample to contain a region of interest 204 to be processed with a charged particle beam. A first set of primary fiducials 206 is created proximal to region of interest 204. A first set of backup fiducials 208 is then created adjacent primary fiducials 206 so that region of interest 204 can be referenced to both primary fiducials 206 and backup fiducials 208. Image frame 202 is set to include region of interest 204 and primary fiducials 206 while backup fiducials 208 remain outside image frame 202. Processing of region of interest 204 with the beam then begins. Such processing may include milling or any other type of process. The beam periodically images the sample within image frame 202 to determine whether or not there is any shifting or drift of the sample. Any drift can be corrected while continuing processing with the beam. Use of primary fiducials 206 may continue as long as they are recognizable by the image recognition software. However, residual effects of the beam during processing begin to erode primary fiducials 206. Additional damage to primary fiducials 206 occurs during imaging and they are eventually too damaged and pattern recognition begins to fail as seen at 206 in FIG. 2B. When image recognition of damaged primary fiducials 206 begins to fail, image frame 202 is expanded to include backup fiducials 208, as shown in FIG. 2C. Once backup fiducials 208 are included within the expanded image frame 202, they can be used for positional tracking of the region of interest 204.

Figure 2D:
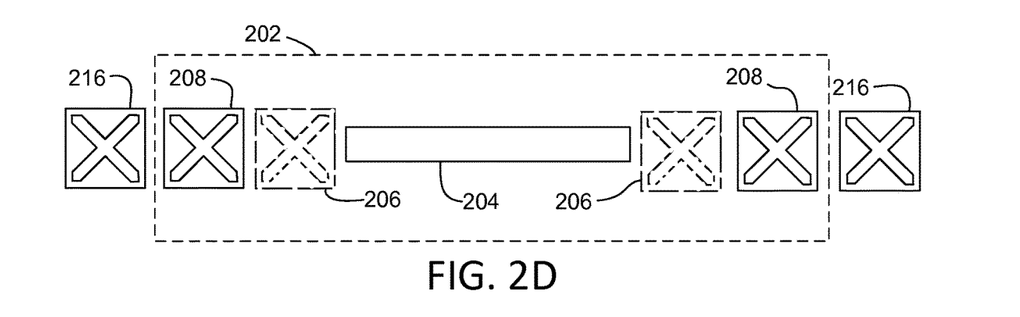
FIG. 2D is similar to FIG. 2C with further backup fiducials outside the image frame.

Preferably, before continuing processing, a second set of backup fiducials 216 is created adjacent backup fiducials 214 as seen in FIG. 2D. Image frame 202 is then set to include region of interest 204 and backup fiducials 214. Processing then continues using the first set of backup fiducials 214 while the second set of backup fiducials 216 remain outside image frame 202 and remain free from damage during beam processing and imaging.

The steps of expanding the image frame to include undamaged backup fiducials and using the undamaged backup fiducials for location tracking can be repeated to provide consistent positional tracking for the duration of processing with the beam. Further replacement backup fiducials (not shown) may be created in any suitable area where they will not be damaged by the beam until needed to replace unrecognizable fiducials. In some embodiments, the series of further replacement backup fiducials progresses linearly away from either side of the region of interest, as shown in FIG. 2D. However, other arrangements for a series of further backup fiducials are possible. For example, a series of further backup fiducials could be placed in a linear series up or down from the region of interest. Arrangements for a series of backup fiducials may be chosen based on the space available for backup fiducials. In other embodiments, secondary and further replacement backup fiducials are created at any time prior to, during, or after beam processing.

FIGS. 3A-3F show a second embodiment for using fiducials to correct for beam drift. A sample is provided with an area containing a region of interest for processing with a charged particle beam similar to that shown and described in FIGS. 2A-2D.

Figure 3A:
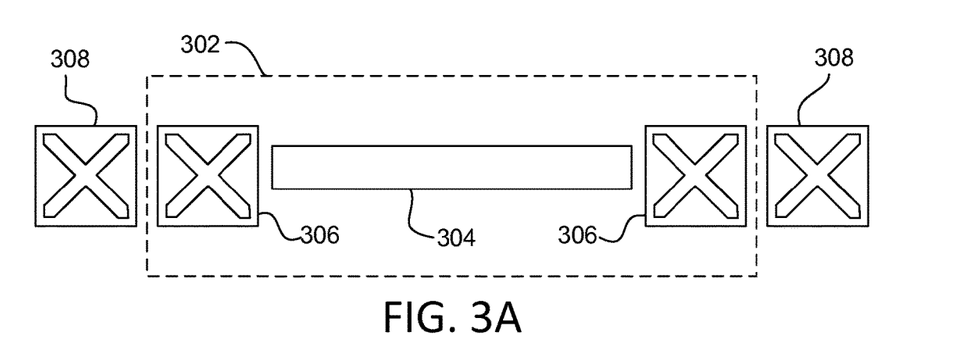
FIG. 3A shows an image frame that includes a region of interest with intact primary fiducials and backup fiducials located outside the image frame.
Figure 3B:
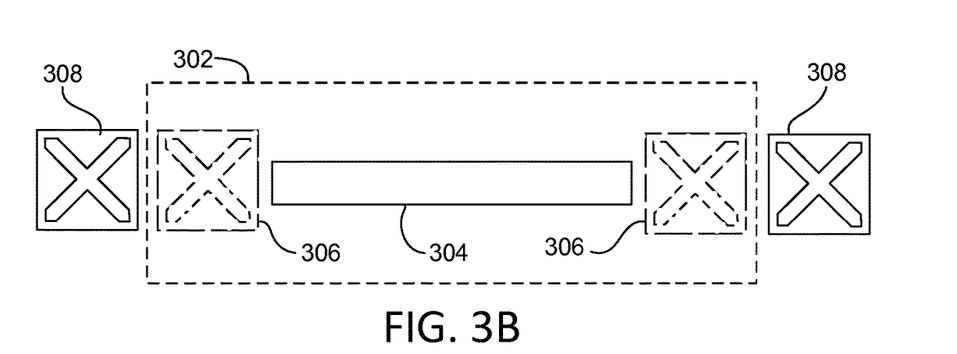
FIG. 3B is similar to FIG. 3A with damaged primary fiducials.
Figure 3C:
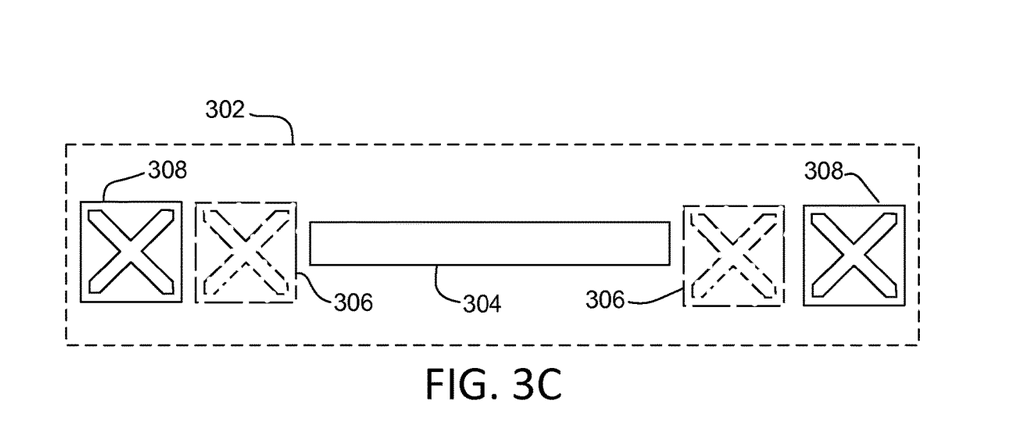
FIG. 3C is similar to FIG. 3B with an expanded image frame.

Referring now to FIG. 3A, an area within an image frame 302 is taken on a sample to contain a region of interest 304 to be processed with a charged particle beam. A first set of primary fiducials 306 is created proximal to region of interest 304. A first set of backup fiducials 308 is then created adjacent primary fiducials 306 so that region of interest 304 can be referenced to both primary fiducials 306 and backup fiducials 308. Image frame 302 is set to include region of interest 304 and primary fiducials 306 while backup fiducials 308 remain outside image frame 302. Processing of region of interest 304 with the beam then begins. Such processing may include milling or any other type of process. The beam periodically images the sample within image frame 302 to determine whether or not there is any shifting or drift of the sample. Any drift can be corrected while continuing processing with the beam. Use of primary fiducials 306 may continue as long as they are recognizable by the image recognition software. However, residual effects of the beam during processing begin to erode primary fiducials 306. Additional damage to primary fiducials 306 occurs during imaging and they are eventually too damaged and pattern recognition begins to fail as seen at 310 in FIG. 3B. When image recognition of damaged primary fiducials 306 begins to fail and are no longer identifiable by image recognition, location tracking of the region of interest 304 using damaged primary fiducial markers 310 is no longer possible. Image frame 302 is then expanded to include backup fiducials 308, as shown in FIG. 3C. Once backup fiducials 308 are included within the expanded image frame 302, they can be used for positional tracking of the region of interest 304.

Figure 3D:
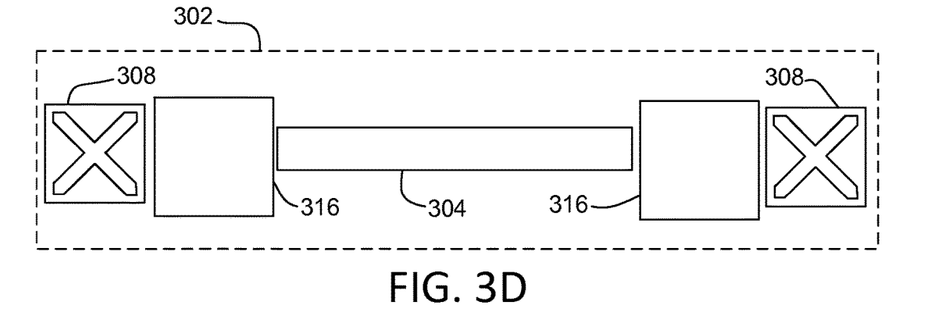
FIG. 3D is similar to FIG. 3C showing a material deposition over damaged primary fiducials.
Figure 3E:
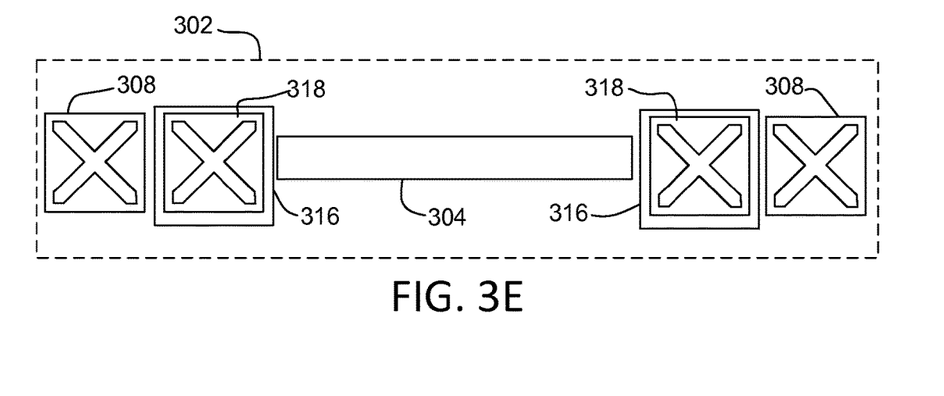
FIG. 3E is similar to FIG. 3D with recreated primary fiducials.
Figure 3F:
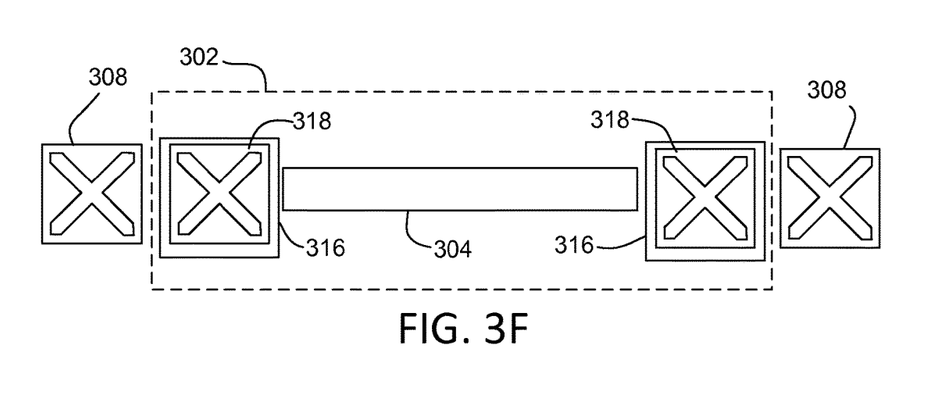
FIG. 3F is similar to FIG. 3A with recreated primary fiducials within a reduced image frame.

As seen in FIGS. 3D-3F, preferably, before continuing processing, backup fiducials 308 are used to determine the exact location 316 of original primary fiducials 306 which are then recreated as replacement primary fiducials 318 in the same location 316 as originally created. Recreation of primary fiducials may include depositing a layer of material over the original location 316 to provide a clean or blank area to recreate replacement primary fiducials 318. However, other methods may be employed to form the new primary fiducials. After replacement primary fiducials 318 have been created, expanded image frame 302 is contracted to include region of interest 304 and replacement primary fiducials 318, while backup fiducials 308 remain outside of image frame 302. Processing of the sample with the beam can then resume, using the replacement primary fiducials 318 for location tracking.

The embodiment described in FIGS. 3A-3F are advantageous in that recreation of the primary fiducials eliminates the possibility of any accumulative error that may arise be creating a new set of backup fiducials. Additionally, the image frame used during the processing cycle remains the same size allowing for more accurate compensation of any drift because increasing the size of the image frame may cause a loss of accuracy in placement of the region of interest.

In some embodiments, the steps of expanding the image frame to include the backup fiducials 308, using the backup fiducials 308 for positional tracking, creating replacement primary fiducials 318, and resuming use of the replacement primary fiducials for positional tracking is performed until processing is complete.

Figure 4:
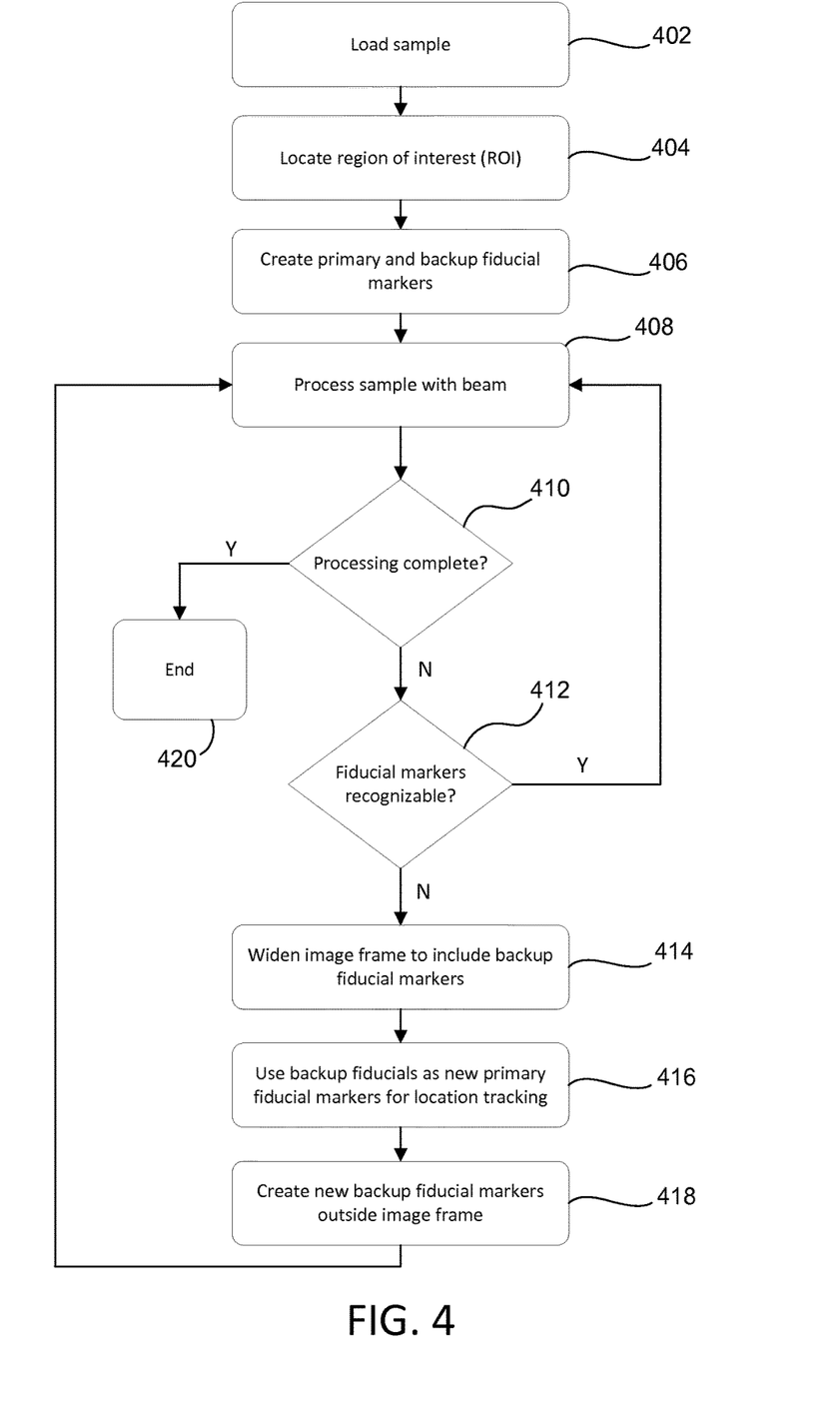
FIG. 4 is a flowchart showing the steps of creating new backup fiducials.

Referring now to FIG. 4, a flow diagram is shown for a method of creating backup fiducials in accordance with various embodiments, such as seen in FIGS. 2A-2D. In step 402, a sample is loaded into a charged particle beam system and at step 404, a region of interest is located on the sample. Primary and first backup fiducials are created at step 406 proximal to the region of interest. Processing with the beam begins at step 408 using the primary fiducials for position tracking during processing. During processing, the method proceeds to step 410, where it is determined whether or not processing is complete. If processing is complete, the method continues to step 420 and processing terminates.

If processing has not completed, the method proceeds to step 412 where an image recognition routine attempts to identify the fiducials currently being used for positional tracking. If the current fiducials are recognizable, they may continue to be used for positional tracking, and the method returns to processing the sample with the beam in step 408. This cycle can repeat until either processing is complete, or image recognition fails to identify the current fiducials.

If it is determined in step 412 that image recognition fails to identify the fiducials, the method continues with expanding the image frame in step 414 to include the backup fiducials. The backup fiducials are then used for locational tracking in step 416, and new or further backup fiducials may be created in step 418 outside the expanded image frame. Once new backup fiducials have been created 418 and positional tracking has been resumed, the method returns to processing 408 the sample with the beam, until processing is complete 410.

Figure 5:
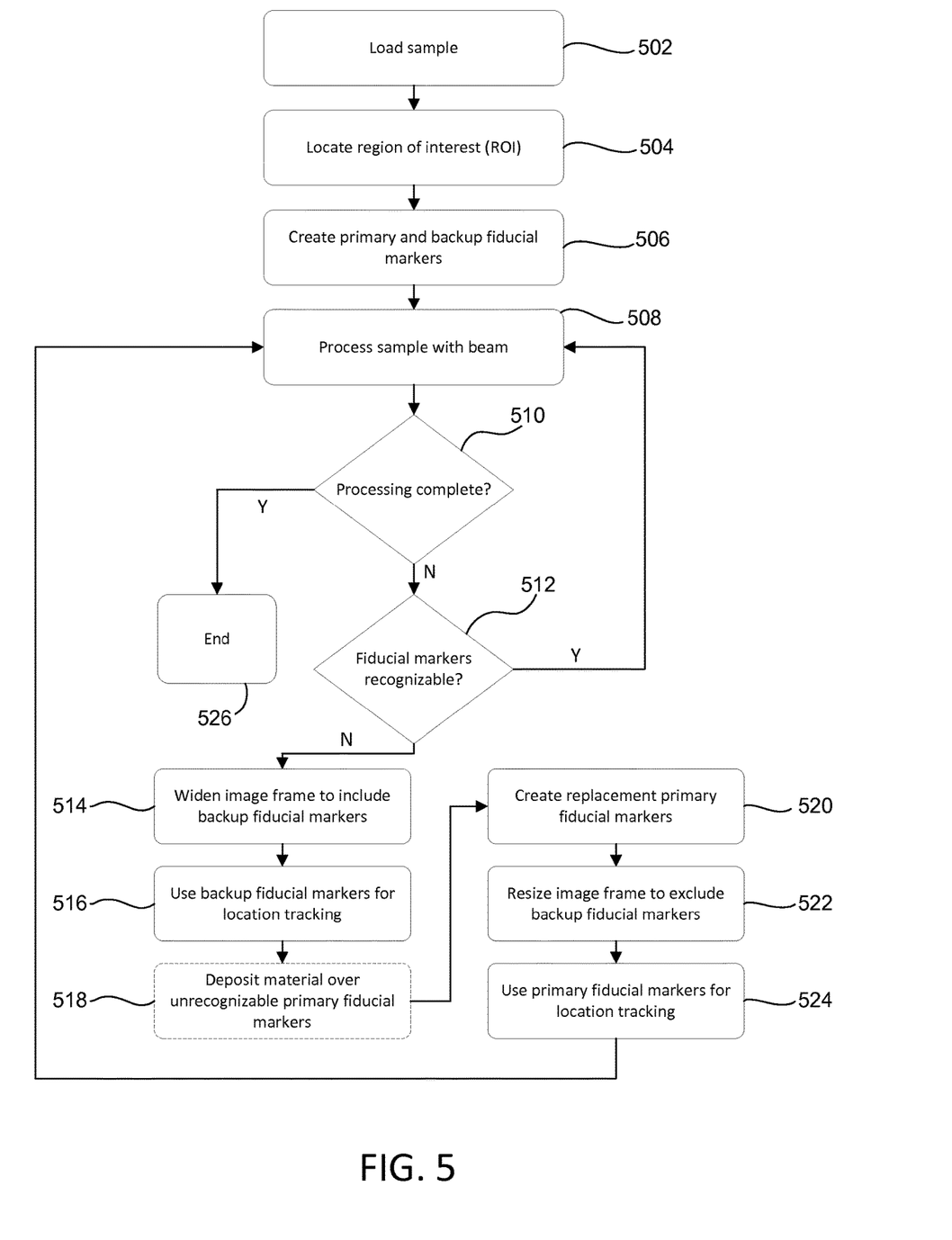
FIG. 5 is a flowchart showing the steps recreating primary fiducials.

In FIG. 5, a flow diagram is shown for a method of recreating primary fiducials in accordance with various embodiments, such as seen in FIGS. 3A-3F. In step 502, a sample is loaded into a charged particle beam system and a region of interest is located on the sample in step 504. Primary and first backup fiducials are created at step 506 proximal to the region of interest. Beam processing then begins at step 508 using the primary fiducials for position tracking during processing. During processing, the method proceeds to step 510, where it is determined whether or not processing is complete. If processing is complete, the method continues to step 526 and processing terminates.

If processing has not completed, the method proceeds to step 512 where an image recognition routine attempts to identify the fiducials currently being used for positional tracking. If the current fiducials are recognizable, they may continue to be used for positional tracking, and the method returns to processing the sample with the beam in step 508. This cycle can repeat until either processing is complete, or image recognition fails to identify the current fiducials.

If in step 512 image recognition fails to identify the fiducials, the method continues with expanding the image frame to include the backup fiducials in step 514. The backup fiducials are then used for locational tracking in step 516. In optional step 518, material may be deposited over the original location of the primary fiducials using, for example, beam-induced deposition, to prepare for the creation of replacement primary fiducials. In step 520, replacement primary fiducials are created. After the replacement primary fiducials are recreated in step 520, the image frame is contracted to exclude the backup fiducials in step 522, and the replacement primary fiducials are used for location tracking in step 524.

The method then returns to processing the sample with the beam in step 508 until it is determined that processing is complete in step 510. The cycle of beam processing, checking that the fiducials currently being used for tracking are recognizable, creating replacement fiducials when the previous fiducials are no longer recognizable, and using replacement fiducials for location tracking may continue until beam processing is complete at step 526.

In FIGS. 2A-2D, and 3A-3F, two fiducial markers are used at any time for positional tracking, one on each side of a region of interest. Other arrangements of fiducial markers, numbers of fiducial markers used at any time, or the shape of the fiducial markers are possible and may be advantageous. The shape, placement, and number of fiducial markers shown in the FIGS. 2A-2D, and 3A-3F are merely examples of possible arrangements. In addition, the shape of the image frame in FIGS. 2A-2D, and 3A-3F is shown as an example, and other shapes or sizes of image frames are possible, in accordance with various embodiments.

In some embodiments, replacement primary fiducial markers are created 520 in the same place as the previously used, but now unrecognizable primary fiducial markers were located. In a further embodiment, material is deposited 518 over the unrecognizable primary fiducial markers before creation 520 of replacement primary fiducial markers. In other embodiments, the replacement primary fiducial markers are created in a location other than where the previous primary fiducial markers were located. In some further embodiments, material is deposited 518 in the new location prior to creation 520 of the replacement primary fiducial markers. If the replacement primary fiducial markers are created at a position other than the original location, the image frame at step 522 would be re-sized to include the replacement primary fiducials while excluding the backup fiducials. In this case, the new image frame for the replacement primary fiducials may be a different size or shape than the image frame for the previous primary fiducials.

Fiducial markers located outside the image frame receive beam exposure during positional tracking while creating replacement fiducial markers, however their exposure is limited to the time required to create replacement fiducial markers. Due to the limited beam exposure of the fiducial markers outside the image frame, they remain recognizable by image recognition for substantially longer than the fiducial markers used for location tracking during beam processing.

Figure 6:
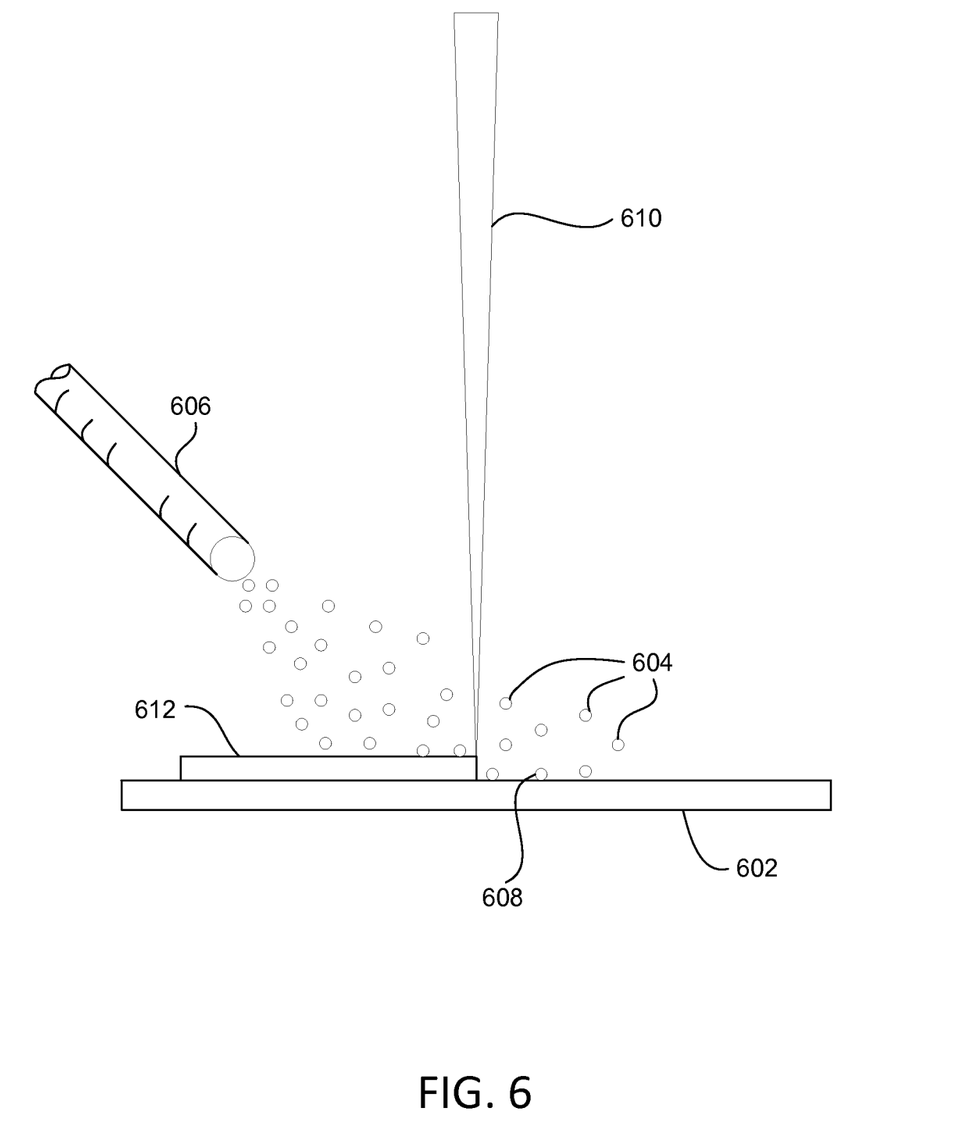
FIG. 6 shows a process for beam-induced deposition.

FIG. 6 shows a process for beam-induced deposition, such as that performed in step 518 in FIG. 5. A deposition gas 604 is directed towards sample surface 602 through delivery needle 606. Some of the deposition gas molecules become adsorbed 608 on the sample surface. Adsorbed deposition gas molecules 608 can be decomposed by charged particle beam 610 to form a deposition 612 on the sample surface 602. Other techniques of forming depositions on a sample surface 602 are possible as well.

Figure 8:
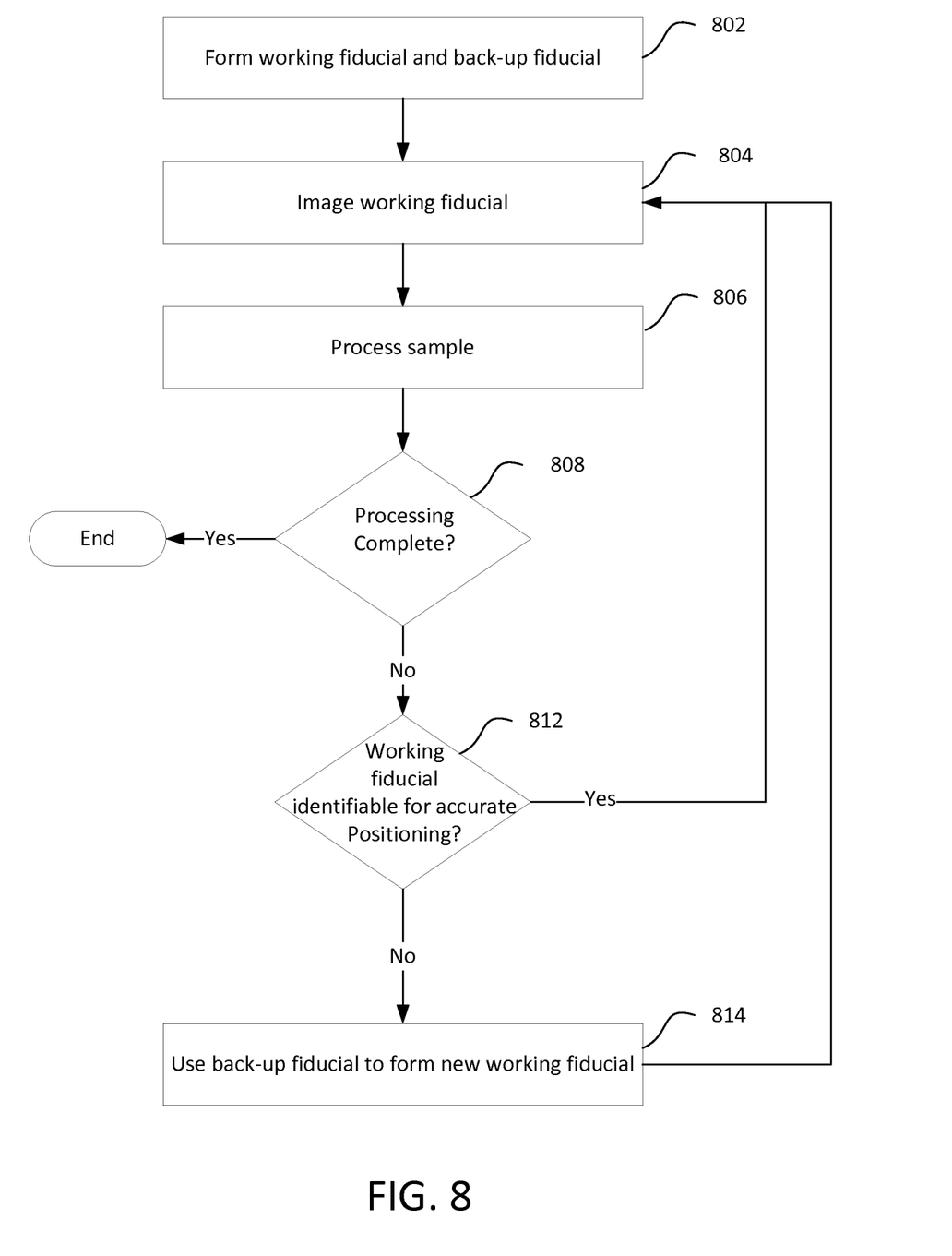
FIG. 8 is a flowchart showing the steps of a dynamic fiducial process.

FIG. 8 is a flow chart showing an embodiment of the invention. In step 802, a working fiducial and a back-up fiducial are formed, for example, by ion beam milling. In step 804, a charged particle beam is directed to the working fiducial to form an image. In step 806, the location of the working fiducial is used to determine a position on the sample, and the sample is processed in step 806. If the processing is complete, processing ends. If processing is not complete, the system determines whether or not the working fiducial can be accurately recognized or whether it has been degraded by the charged particle beam to the point where the position of the fiducial cannot be precisely located by an operator in manual operation or by image recognition software during automated processing. If the working fiducial is not identifiable, then the backup fiducial is imaged and the position of the back-up fiducial is used as a reference to create a new working fiducial. The new working fiducial can then be used for positioning the beam for further processing the sample in step 806. New working fiducials can be prepared by the process shown in FIGS. 2A-2D or FIGS. 3A-3F and described above in FIG. 4 or FIG. 5.

In some embodiments, the fiducials process described above are used during the creation of a sample, such as a lamella or a pillar, for imaging on a TEM or other instrument. In accordance with one method for forming a lamella, two trenches are milled in the sample, leaving a thin lamella between the trenches. Because the lamella should be accurately placed and should have a precise thickness, the beams are intermittently aligned using the working fiducial during the formation of the lamella. When the working fiducial is degraded so that it cannot be used to acquire an accurate position, another working fiducial is formed using the back-up fiducial to position the new working fiducial. That is, dynamic fiducial creation is useful in lamella creation, and the processing of the work piece shown in FIG. 4, 5, or 8 can be forming a lamella.

In some embodiments, the fiducials are used during a "slice-and-view" process. In such a process, a trench is milled in the work piece, and an exposed wall, typically orthogonal to the sample surface, is viewed using scanning electron microscopy. An additional "slice" is removed from the exposed wall, and an electron beam image is formed of the newly exposed surface. This process is repeated, and the images of the slices can be combined to form a three dimensional image of a region of the sample. Before each slice, the beam can be aligned using a working fiducial. When the working fiducial is degraded, the back-up fiducial is used to position the beam to create a new working fiducial. The new working fiducial is then used to create additional slices, until the new working fiducial is no longer useable, and then another new fiducial is created, the process continuing until the slice-and-view is complete. That is, dynamic fiducial creation is useful in slice-and-view, and the processing of the work piece shown in FIG. 4, 5, or 8 can be forming the slices in a slice-and-view process.

Figure 7:
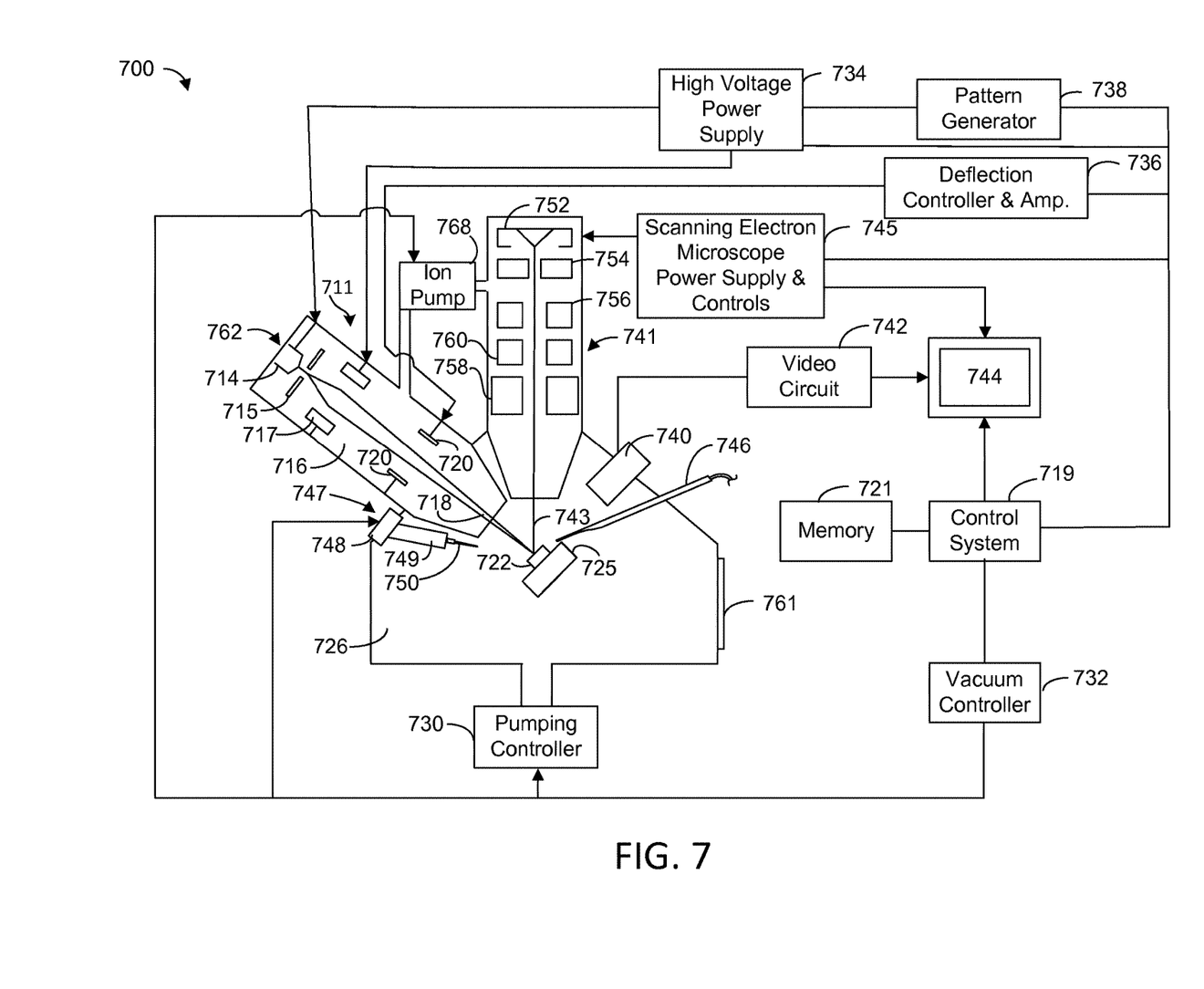
FIG. 7 shows a type of beam system for use with the invention.

FIG. 7 shows one type of a beam apparatus 700 for use with the present invention. The invention is generally directed to a method using an ion beam, however, the method of this invention could be carried out in a dual beam system that includes an ion beam system 711 and a scanning electron microscope (SEM) 741, along with power supply and control unit 745, is provided with dual beam apparatus 700. For example, ion beam system 711 includes an evacuated chamber having an upper neck portion 762 within which are located ion source 714 and an ion beam focusing column 716. The ion column 716 includes ion source 714, extraction electrode 715, a focusing element 717, electrostatic deflection plates 720, and a focused ion beam 718. Focused ion beam 718 passes from ion source 714 through ion beam focusing column 716 and between electrostatic deflection plates schematically indicated at 720 toward substrate 722, which comprises, for example, a sample positioned on movable X-Y stage 725 within lower chamber 726.

Movable X-Y stage 725 can preferably move in a horizontal plane (X and Y axes) and vertically (Z axis). Movable X-Y stage 725 can also tilt approximately sixty (60) degrees and rotate about the Z axis. A door 761 is opened for inserting substrate 722 onto moveable X-Y stage 725 and also for servicing an internal gas supply reservoir, if one is used. The door is interlocked so that it cannot be opened if the system is under vacuum.

An ion pump 768 is employed for evacuating upper neck portion 762. The ion pump 768 may also evacuate SEM column 741, or a separate pump (not shown) may be used for evacuation of SEM column 741. The chamber 726 is evacuated with turbomolecular and mechanical pumping system 730 under the control of vacuum controller 732. The vacuum system provides within chamber 726 a vacuum of between approximately $1\times10^{-7}$ Torr and $5\times10^{-4}$ Torr. If an etch-assisting gas, an etch-retarding gas, or a deposition precursor gas is used, the chamber background pressure may rise, typically to about $1\times10^{-5}$ Torr.

The high voltage power supply provides an appropriate acceleration voltage to electrodes in ion beam focusing column 716 for energizing and focusing ion beam 718. When it strikes substrate 722, material is sputtered, that is physically ejected, from the sample. Alternatively, focused ion beam 718 can decompose a precursor gas to deposit a material.

High voltage power supply 734 is connected to ion source 714 as well as to appropriate electrodes in ion beam focusing column 716 for forming an approximately 1 keV to 60 keV focused ion beam 718 and directing the same toward a sample. Deflection controller and amplifier 736, operated in accordance with a prescribed pattern provided by pattern generator 738, is coupled to electrostatic deflection plates 720 whereby focused ion beam 718 may be controlled manually or automatically to trace out a corresponding pattern on the upper surface of substrate 722. In some systems the deflection plates are placed before the final lens, as is well known in the art. Beam blanking electrodes (not shown) within ion beam focusing column 716 cause focused ion beam 718 to impact onto blanking aperture (not shown) instead of substrate 722 when a blanking controller (not shown) applies a blanking voltage to the blanking electrode.

The source typically is capable of being focused into a sub one-tenth micrometer wide beam at substrate 722 for either modifying the substrate 722 by ion milling, enhanced etch, material deposition, or for the purpose of imaging the substrate 722.

SEM column 741 includes electron source 752, electron source electrodes 754, electron lens 756, electron deflector 760, and electron objective lens 758. The components of SEM column 741 are controlled by SEM power supply and control unit 745.

A charged particle detector 740, such as an Everhart Thornley or multi-channel plate, used for detecting secondary ion or electron emission is connected to a video circuit 742 that supplies drive signals to video monitor 744 and receiving deflection signals from a control system 719. The location of charged particle detector 740 within lower chamber 726 can vary in different embodiments. For example, a charged particle detector 740 can be coaxial with the ion beam and include a hole for allowing the ion beam to pass. In other embodiments, secondary particles can be collected through a final lens and then diverted off axis for collection.

A micromanipulator 747, such as the AutoProbe 1000™ from Omniprobe, Inc., Dallas, Tex., or the Model MM3A from Kleindiek Nanotechnik, Reutlingen, Germany, can precisely move objects within the vacuum chamber. Micromanipulator 747 may comprise precision electric motors 748 positioned outside the vacuum chamber to provide X, Y, Z, and theta control of a portion 749 positioned within the vacuum chamber. The micromanipulator 747 can be fitted with different end effectors for manipulating small objects. In the embodiments described herein, the end effector is a thin probe 750.

A gas delivery system 746 extends into lower chamber 726 for introducing and directing a gaseous vapor toward substrate 722. U.S. Pat. No. 5,851,413 to Casella et al. for "Gas Delivery Systems for Particle Beam Processing," assigned to the assignee of the present invention, describes a suitable gas delivery system 746. For example, iodine can be delivered to enhance etching, or a metal organic compound can be delivered to deposit a metal. U.S. Pat. No. 5,851,413 is incorporated herein by reference in their entirety. Furthermore, where a definition or use of a term in a reference, which is incorporated by reference herein is inconsistent or contrary to the definition of that term provided herein, the definition of that term provided herein applies and the definition of that term in the reference does not apply.

Control system 719 controls the operations of the various parts of dual beam apparatus 700. Through control system 719, a user can cause ion beam 718 or electron beam 743 to be scanned in a desired manner through commands entered into a conventional user interface (not shown). Alternatively, control system 719 may control dual beam apparatus 700 in accordance with programmed instructions stored in a memory 721. In some embodiments, dual beam apparatus 700 incorporates image recognition software, such as software commercially available from Cognex Corporation, Natick, Mass., to automatically identify regions of interest, and then the system can manually or automatically extract samples in accordance with the invention. For example, the system could automatically locate similar features on semiconductor wafers including multiple devices, and take samples of those features on different (or the same) devices.

While the foregoing exemplary embodiments describe charged particle beam apparatuses, the invention is not limited to being implemented in any particular type of hardware.

While embodiments of the invention have been shown and described, modifications thereof can be made by one skilled in the art without departing from the spirit and teachings of the invention. The embodiments described herein are exemplary only, and are not intended to be limiting. Many variations and modifications of the invention disclosed herein are possible, and alternative embodiments that result from combining, integrating, and/or omitting features of the embodiments disclosed herein are also within the scope of the invention. Where numerical ranges or limitations are expressly stated, such express ranges or limitations should be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit, Rl and an upper limit, Ru, is disclosed, any number falling within the range is specifically disclosed. In particular, the following numbers within the range are specifically disclosed: R=Rl+k*(Ru−Rl),wherein k is a variable ranging from 1 percent to 100 percent with a 1 percent increment, i.e., k is 1 percent, 2 percent, 3 percent, 4 percent, 5 percent, 50 percent, 51 percent, 52 percent, 95 percent, 96 percent, 97 percent, 98 percent, 99 percent, or 100 percent. Moreover, any numerical range defined by two R numbers as defined in the above is also specifically disclosed.

The following are non-limiting, specific embodiments in accordance with the present disclosure:

A first embodiment, which is a method of aligning a charged particle beam for processing, comprising:

creating at least one primary fiducial at a location proximal to a region of interest, the at least one primary fiducial being identifiable by image recognition;

creating at least one first backup fiducial;

processing the region of interest with the charged particle beam using the at least one primary fiducial to position the beam relative to the region of interest; and continuing processing the region of interest using the at least one backup fiducial to track the location of the region of interest.

A second embodiment, which is the method of the first embodiment, further comprising creating at least one second backup fiducial being identifiable by image recognition, and continuing processing of the region of interest using the at least one first backup fiducial to track the location of the region of interest.

A third embodiment, which is the method of the first embodiment, in which continuing processing the region of interest using the at least one backup fiducial to track the location of the region of interest occurs after the primary fiducial is degraded by exposure to the charged particle beam.

A fourth embodiment, which is the method of the second embodiment, further comprising cyclically creating further backup fiducials used sequentially to track the region of interest.

A fifth embodiment, which is the method of the first embodiment, further comprising creating a new at least one primary fiducial, and continuing processing the region of interest using the new at least one primary fiducial.

A sixth embodiment, which is the method of the fourth embodiment, wherein the new at least one primary fiducial is a recreation of the previous primary fiducial.

A seventh embodiment, which is the method of the sixth embodiment, wherein the at least one primary fiducial is recreated at the same location it was originally created.

An eighth embodiment, which is the method of the sixth embodiment, wherein recreating the at least one primary fiducial comprises depositing a layer of material over the location proximal to the region of interest, and creating a new at least one primary fiducial at the location proximal to the region of interest and identifiable by image recognition.

A ninth embodiment, which is the method of the sixth embodiment, wherein the new at least one primary fiducial is located at a position other than the location of the previous at least one primary fiducial.

A tenth embodiment, which is a method for forming a lamella for transmission electron viewing, the method comprising:

creating at least one primary fiducial at a location proximal to a region of interest, the at least one primary fiducial being identifiable by image recognition;

creating at least one first backup fiducial being identifiable by image recognition;

directing a focused ion beam to mill cavities on both sides of the region of interest to form a lamella using the at least one primary fiducial to track the location of the region of interest until the at least one primary fiducial begins to fail to be identifiable by image recognition; and continuing processing the region of interest using the at least one first backup fiducial to track the location of the region of interest.

A eleventh embodiment, which is the method of the tenth embodiment, further comprising creating at least one second backup fiducial being identifiable by image recognition, and continuing processing the region of interest using the at least one first backup fiducial to track location of the region of interest.

A twelfth embodiment, which is the method of the eleventh embodiment, further comprising cyclically creating further backup fiducials used sequentially to track the location of the region of interest.

A thirteenth embodiment, which is the method of the twelfth embodiment, further comprising automatically performing the cycle of creating further backup fiducials until processing of the region of interest is ended.

A fourteenth embodiment, which is the method of the tenth embodiment, wherein the at least one first backup fiducial is located outwardly from the at least one primary fiducial away from the region of interest.

A fifteenth embodiment, which is the method of the eleventh embodiment, wherein the at least one second backup fiducial is located outwardly from the at least one first backup fiducial away from the region of interest.

A sixteenth embodiment, which is the method of the twelfth embodiment, wherein each further backup fiducial is located outwardly from a preceding fiducial away from the region of interest.

A seventeenth embodiment, which is the method of the tenth embodiment, further comprising creating a new at least one primary fiducial, and continuing processing the region of interest using the new at least one primary fiducial.

An eighteenth embodiment, which is the method of the seventeenth embodiment, wherein the new at least one primary fiducial is a recreation of the previous at least one primary fiducial.

A nineteenth embodiment, which is the method of the eighteenth embodiment, further comprising creating a deposit of material and creating the new at least one primary fiducial in the same place as the deposit.

A twentieth embodiment, which is the method of the seventeenth embodiment, further comprising cyclically repeating the steps of creating a new at least one primary fiducial to track the location of the region of interest.

A twenty-first embodiment, which is an apparatus for charged particle beam processing of a sample, the apparatus comprising:

a sample chamber with a sample stage;

one or more charged particle beam columns for directing charged particle beam or beams toward the sample;

a process gas source for introducing process gas into the sample chamber, the process gas being used for beam-induced etching or deposition;

a controller for controlling operation of the charged particle beam system, the controller comprising one or more processors for executing computer instructions and non-transitory computer memory storing instructions for:

creating at least one primary fiducial at a location proximal to the region of interest, the at least one primary fiducial being identifiable by image recognition;

creating at least one first backup fiducial being identifiable by image recognition;

processing the region of interest with the charged particle beam using the at least one primary fiducial to track the location of the region of interest until the at least one primary fiducial begins to fail to be identifiable by image recognition; and using the at least one first backup fiducial to create at least one further fiducial.

A twenty-second embodiment, which is the method of the twenty-first embodiment, wherein the non-transitory computer memory stores additional instructions for creating the at least one further fiducial forming at least one second backup fiducial being identifiable by image recognition, and continuing processing the region of interest using the at least one first backup fiducial to track location of the region of interest.

A twenty-third embodiment, which is the method of the twenty-first embodiment, wherein the non-transitory computer memory stores additional instructions for cyclically creating further backup fiducials for a prior fiducial used to track the location of the region of interest.

A twenty-fourth embodiment, which is the method of the twenty-second embodiment, wherein the stored computer instructions comprise creating backup fiducials in new locations relative to the region of interest.

A twenty-fifth embodiment, which is the method of the twenty-second embodiment, wherein the stored computer instructions comprise recreating the at least one primary fiducial in the location proximal to the region of interest.

Use of the term "optionally" with respect to any element of a claim is intended to mean that the subject element is required, or alternatively, is not required. Both alternatives are intended to be within the scope of the claim. Use of the term "may" to introduce features of embodiments of the disclosure (e.g., "In an embodiment, the widget may be connected to a cog,") is intended to mean that embodiments reciting said features are considered to be within the scope of the invention and such embodiments shall be construed as being positively recited by the specification. However, use of the term "may" to introduce features of embodiments is not an indication that embodiments failing to recite said features are considered outside the scope of the invention. Further, although various features of embodiments are described in plural form (e.g., attachment surfaces, localized attractive sites, etc.), embodiments having single instances of said features (e.g., one attachment surface, one localized attractive site, etc.), alone or in combination with single or plural instances of other features, are also contemplated to be within the scope of the invention unless explicitly indicated otherwise. Use of broader terms such as "comprises," "includes," "having," etc. should be understood to provide support for narrower terms such as "consisting of," "consisting essentially of," "comprised substantially of," etc.

Although the present invention and its advantages have been described in detail, it should be understood that various changes, substitutions and alterations can be made to the embodiments described herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

Accordingly, the scope of protection is not limited by the description set out above but is only limited by the claims which follow, that scope including all equivalents of the subject matter of the claims. Each and every claim is incorporated into the specification as an embodiment of the present invention. Thus, the claims are a further description and are an addition to the embodiments of the present invention. The discussion of a reference in the Detailed Description of the Embodiments is not an admission that it is prior art to the present invention, especially any reference that may have a publication date after the priority date of this application.

I claim:

1. A method of aligning a charged particle beam for processing, comprising:

creating at least one primary fiducial at a location proximal to a region of interest, the at least one primary fiducial being identifiable by image recognition;

creating at least one first backup fiducial;
processing the region of interest with the charged particle beam using the at least one primary fiducial to position the beam relative to the region of interest; and
continuing processing the region of interest using the at least one backup fiducial to track the location of the region of interest after the primary fiducial is degraded by exposure to the charged particle beam.

2. The method of claim 1, further comprising creating at least one second backup fiducial being identifiable by image recognition, and continuing processing of the region of interest using the at least one first backup fiducial to track the location of the region of interest.

3. The method of claim 2, further comprising cyclically creating further backup fiducials used sequentially to track the region of interest.

4. The method of claim 1, further comprising creating a new at least one primary fiducial, and continuing processing the region of interest using the new at least one primary fiducial.

5. The method of claim 4, wherein the new at least one primary fiducial is a recreation of the previous primary fiducial in the same location it was originally created.

6. The method of claim 5, wherein recreating the at least one primary fiducial comprises depositing a layer of material over the location proximal to the region of interest, and creating a new at least one primary fiducial at the location proximal to the region of interest and identifiable by image recognition.

7. The method of claim 4, wherein the new at least one primary fiducial is located at a position other than the location of the previous at least one primary fiducial.

8. A method for forming a lamella for transmission electron viewing, the method comprising:
creating at least one primary fiducial at a location proximal to a region of interest, the at least one primary fiducial being identifiable by image recognition;
creating at least one first backup fiducial being identifiable by image recognition;
directing a focused ion beam to mill cavities on both sides of the region of interest to form a lamella using the at least one primary fiducial to track the location of the region of interest until the at least one primary fiducial begins to fail to be identifiable by image recognition; and
continuing processing the region of interest using the at least one first backup fiducial to track the location of the region of interest after the primary fiducial is degraded by exposure to the charged particle beam.

9. The method of claim 8, further comprising creating at least one second backup fiducial being identifiable by image recognition, and continuing processing the region of interest using the at least one first backup fiducial to track location of the region of interest.

10. The method of claim 9, further comprising cyclically creating further backup fiducials used sequentially to track the location of the region of interest.

11. The method of claim 10, further comprising automatically performing the cycle of creating further backup fiducials until processing of the region of interest is ended.

12. The method of claim 8, wherein the at least one first, second, or subsequent backup fiducial is located outwardly from the at least one primary fiducial away from the region of interest.

13. The method of claim 8, further comprising creating a new at least one primary fiducial, and continuing processing the region of interest using the new at least one primary fiducial.

14. The method of claim 13, wherein the new at least one primary fiducial produced by recreation of the previous at least one primary fiducial, or creating a deposit of material and creating the new at least one primary fiducial in the same place as the deposit.

15. The method of claim 13, further comprising cyclically repeating the steps of creating a new at least one primary fiducial to track the location of the region of interest.

16. An apparatus for charged particle beam processing of a sample, the apparatus comprising:
a sample chamber with a sample stage;
one or more charged particle beam columns for directing charged particle beam or beams toward the sample;
a process gas source for introducing process gas into the sample chamber, the process gas being used for beam-induced etching or deposition;
a controller for controlling operation of the charged particle beam system, the controller comprising one or more processors for executing computer instructions and non-transitory computer memory storing instructions for:
creating at least one primary fiducial at a location proximal to the region of interest, the at least one primary fiducial being identifiable by image recognition;
creating at least one first backup fiducial being identifiable by image recognition;
processing the region of interest with the charged particle beam using the at least one primary fiducial to track the location of the region of interest until the at least one primary fiducial begins to fail to be identifiable by image recognition; and
using the at least one first backup fiducial to create at least one further fiducial after the primary fiducial is degraded by exposure to the charged particle beam.

17. The apparatus of claim 16, wherein the non-transitory computer memory stores additional instructions for creating the at least one further fiducial forming at least one second backup fiducial being identifiable by image recognition, and continuing processing the region of interest using the at least one first backup fiducial to track location of the region of interest.

18. The apparatus of claim 16, wherein the non-transitory computer memory stores additional instructions for cyclically creating further backup fiducials for a prior fiducial used to track the location of the region of interest.

19. The apparatus of claim 17, wherein the stored computer instructions comprise creating backup fiducials in new locations relative to the region of interest.

20. The apparatus of claim 17, wherein the stored computer instructions comprise recreating the at least one primary fiducial in the location proximal to the region of interest.

* * * * *